United States Patent [19]

Colavin

[11] Patent Number: 5,666,115

[45] Date of Patent: Sep. 9, 1997

[54] SHIFTER STAGE FOR VARIABLE-LENGTH DIGITAL CODE DECODER

[75] Inventor: Oswald Colavin, Voreppe, France

[73] Assignee: SGS-Thomson Microelectronics, S.A., Gentilly Cedex, France

[21] Appl. No.: 384,560

[22] Filed: Feb. 6, 1995

[30] Foreign Application Priority Data

Feb. 4, 1994 [FR] France .................................. 94 01301

[51] Int. Cl.$^6$ ...................................... H03M 7/42
[52] U.S. Cl. ............................................. 341/67
[58] Field of Search ........................... 341/67, 65

[56] References Cited

U.S. PATENT DOCUMENTS 5,229,863 7/1993 Kao et al. ................................ 341/67
5,245,338 9/1993 Sun ........................................ 341/67

FOREIGN PATENT DOCUMENTS 493 086  7/1992  European Pat. Off. .
4018133  12/1991  Germany .
259922  8/1993  Japan .

*Primary Examiner*—Howard L. Williams
*Attorney, Agent, or Firm*—Robert Groover; Betty Formby; Matthew Anderson

[57] ABSTRACT

The invention relates to a shifter stage for a variable-length digital code decoder which decodes one code per clock cycle, reads input data arriving from a memory, supplies a logical unit on each cycle with a word having the size of the longest variable-length code to be decoded, receives from the logical unit the number of bits of the code decoded on the preceding clock cycle, and effects a shift in the data read equal to the cumulative total of the lengths of codes decoded since the last read of input data.

It comprises a first barrel shift register (11) which reads the input data and performs a shift in the data read equal to the cumulative total of the lengths of the codes decoded between the preceding cycle and the start of the last read, and a second barrel shift register (13) which receives the data arriving from the first register and performs a shift equal to the length of the code decoded on the preceding cycle.

21 Claims, 4 Drawing Sheets

SHIFTER STAGE FOR VARIABLE-LENGTH DIGITAL CODE DECODER

CROSS-REFERENCE TO RELATED APPLICATION

This application claims priority from French App'n 94/01301, filed Feb. 4, 1994, which is hereby incorporated by reference. However, the content of the present application is not necessarily identical to that of the priority application.

Other aspects of the chip of the presently preferred embodiment are also described in copending U.S. patent application Ser. No. 08/384,559, filed simultaneously herewith, entitled "Digital Processing Circuit Comprising Test Registers," and claiming priority from French application 94-01302. This application is hereby incorporated by reference.

BACKGROUND AND SUMMARY OF THE INVENTION

This invention relates to a shifter stage for a variable-length digital code decoder.

A certain number of data storage and data transmission devices use data coding which produces variable-length digital codes. These codes are then stored or transmitted one after another without any special separator. On decoding, each code is recognized by a logical unit and one of the read operations performs a shift, on the input data, corresponding to the number of bits contained in the decoded code.

The role of shift registers, such as one which is the object of this invention, is to decode the variable length digital codes.

Techniques for transmitting and storing digitized pictures make it possible to significantly improve the quality of the final pictures obtained, as compared to analog transmission. The applications of these techniques can also therefore be multiplied.

However, direct transmission and storage of moving digitized pictures requires an extremely high bit rate which in practice calls for these pictures to be compressed and coded. The digitized pictures are therefore coded prior to transmission so as to reduce the amount of data that they represent, and decoded after transmission.

The coding and decoding techniques are of course crucial to the final picture quality obtained, and it became apparent that some standardization would be required to ensure compatibility between the different equipment using these techniques.

Accordingly, a group of experts (known as the Moving Picture Expert Group or "MPEG") drew up the ISO Standard 11172. This standard, often referred to as MPEG, defines coding and decoding conditions of moving pictures, possibly associated with a sound signal, which can be used for storing and recalling pictures from memory and transmitting them.

This MPEG standard can be used to store pictures on compact discs, interactive compact discs, magnetic tapes, and to transmit pictures over local area networks and telephone lines as well as to transmit TV pictures through the air. For a full, detailed description of the entire technique, the reader is invited to read the MPEG standards which are referenced below.

Compressing data according to the MPEG standard may follow several different procedures. Consecutive pictures are collected making up a group of images forming a sequence. A sequence is therefore subdivided into groups of images. Each image is divided into sections and each section is broken down into macro-blocks which constitute the base element used to apply movement compensation and to change, where necessary, the quantization scale.

The macro-blocks are formed from a 16×16 matrix of picture elements (pixels). Each macro-block is divided into six blocks, the first four blocks carrying a brightness signal, and the other two blocks a chrominance signal, respectively blue and red. Each of these six blocks is defined as an 8×8 matrix of picture elements (pixels). Given the analogies existing between the information contained in the different images in a given sequence and in order to reduce the quantity of information stored or transmitted, different types of image are defined within each sequence.

I pictures (Intra frames) are pictures which are coded as a still image and therefore without reference to another image.

P images (Predicated) are deduced starting from the I or P image previously reconstructed.

B images (Bi-directional flames) are deduced from two reconstructed images, one I and one P or two P, one just before and the other just after.

It should be stressed that the images in a sequence are transmitted in the order of decoding and not generally in the order in which they are presented at the time of acquisition or restitution.

The Discrete Cosine Transformation (DCT) is applied on the block level. This DCT transformation transforms the spatial blocks, defined as indicated above as an 8×8 matrix of pixels, into temporal blocks formed also as an 8×8 matrix, of spatial frequencies.

It has been found that in the 8×8 matrix of the temporal block, the continuous background coefficient (DC) placed in the upper left hand corner of the matrix is much more important in terms of the visual impression obtained than the other components corresponding to different frequencies.

More precisely, the higher the frequency, the less sensitive the eye is to it. This is why the levels of frequencies are quantized, especially since the frequencies are high. This quantization is ensured by an algorithm that is not imposed by the standard, and which could be a quantization and variable length coding (VLC) operation.

The matrix in the frequency domain obtained by the DCT transformation is next processed by a matrix called "quantization matrix" which is used to divide each of the terms of the matrix of the temporal domain by a value that is linked to its position, and which takes account of the fact that the weight of the different frequencies presented by these coefficients is variable.

After each value has been rounded to the closest integer value, this operation results in a large number of coefficients equal to zero.

It should be stressed that for the intra macro-blocks, the quantization value of the DC coefficient is constant, for example 8. The non-zero frequency coefficients are then coded according to zigzag type scanning with reference to a Huffman table, which gives a variable-length coded value to each of the coefficients of the matrix and reduces the volume. Preferably, the coefficients representing the continuous backgrounds are transmitted after quantization and, in addition, the quantization matrix is optimized, in such a way that the volume of data is under a predetermined level which corresponds to the maximum storage or transmission possibilities, without any serious reduction in the quality of information transmitted.

Type I frames are coded without use of the movement vector. Conversely, P and B frames use movement vectors, at least for certain macro-blocks which make up these frames, allowing coding efficiency to be increased and indicating from which part of the reference image(s) a particular macro-block of the considered frame must be deduced.

The search for the movement vector is the object of optimization at the time of coding, and the movement vector is itself coded by using the DPCM technique, which best exploits the existing correlation between the movement vectors of the different macro-blocks of a given image. They are finally the object of variable-length coding (VLC).

All the data concerning a coded sequence form the bit stream that is either recorded or transmitted. Such a bit stream begins with a sequence header containing a certain amount of information and parameters whose values are maintained throughout the sequence.

Likewise, the sequence is broken down into groups of frames, each of these groups is preceded by a group header and the data representing each frame are themselves preceded by a frame header.

The MPEG Standard technique for coding moving pictures includes such a technique and therefore requires the use of shifter stages, these being the object of this invention.

Figure 1:
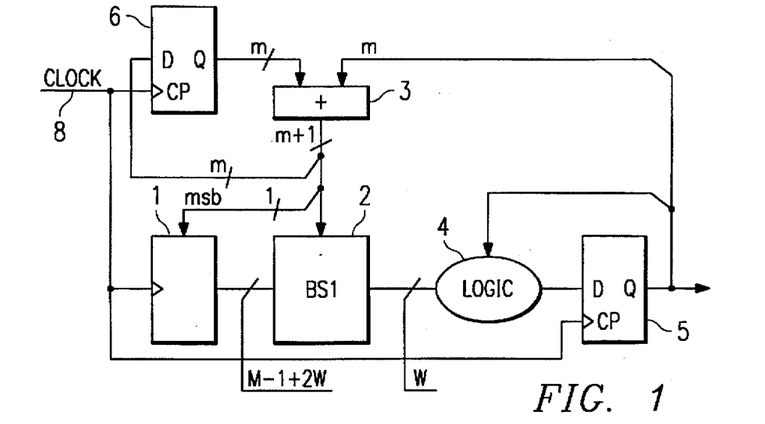
FIG. 1 is a example of a device of the prior art as described above.

Shifter stages for decoding variable-length digital codes, decoding one code per clock cycle, have up until now complied with the device shown in FIG. 1. A memory block 1 acquires input data made up of a number of bits M from an upstream memory (not shown). Barrel shifter register 2, whose shift is commanded by adder 3, supplies logical unit 4 with a word whose length w has been previously defined as being equal to the maximum length of a variable-length code to be decoded, which, because of the shift value m+1 defined by adder 3, comes after the digital data presented by input memory element 1 that have already been decoded.

Logical unit 4 decodes the first identifiable code from the word it receives and sends it to memory unit 5. The units 4 and 5 form a finite state machine which can also be implemented using a Program Logic Array (PLA). Adder 3 cooperates with a memory block 6 in such a way that it receives from memory block 5 the length m of the code decoded in the preceding cycle, and from cumulative memory block 6 the previous cumulative value of all the lengths of decoded codes. Adder 3 then commands barrel shift register 2 such that, as indicated above, it performs a shift corresponding to the cumulative length of all codes already decoded by logical unit 4 since the last acquisition of input data by input memory block 1.

When accumulator 3 overflows (msb=1), it commands a new read operation by input memory block 1.

Clock signal 8 coordinates all these operations. Thus in this prior art device, the addition by adder 3 of the lengths of codes previously decoded, the shifting by barrel shift register 2 of the corresponding values, and the logic decoding processing by logical unit 4 must all be performed successively during the same clock cycle.

The total volume of data which must be processed is imposed by the standard that must be respected by the device in which the shifter stage that we have just described is included.

The speed of this processing depends on the production of the circuit and may be increased by increasing the number of gates on the produced circuit. This, however, would mean increasing the surface area of circuits and accepting higher power consumption.

The object of this invention is therefore to produce a shifter stage for decoding variable-length digital codes which, because of its structure, is faster in operation but avoids the use of a large number of gates.

A further object of the invention is to propose a shifter stage for decoding variable-length digital codes that is both efficient and reliable, requires a relatively small surface area of silicon, and consumes little electrical power.

To achieve this, the invention relates to a shifter stage for decoding variable-length digital codes decoding one code per clock cycle, and which reads input data arriving from a memory, supplies a decoding logical unit on each cycle with a word having the size of the longest variable-length code to be decoded, receives from the logical unit the number of bits of the code decoded on the preceding clock cycle, and performs a shift in the read data equal to the cumulative total of the lengths of codes already decoded since the last read of input data.

According to the invention, it comprises a first barrel shift register which reads the input data and performs a shift in the data read equal to the cumulative total of the lengths of codes decoded between the preceding cycle and the start of the last read, and a second barrel shift register which receives data arriving from the first register and performs a shift equal to the length of the code decoded at the time of the preceding cycle.

According to different preferred embodiments, the device of the invention comprises the following characteristics taken in any technically feasible combination:

a memory block is interposed between the first barrel shift register and the second barrel shift register, the data supplied by the second barrel shift register directly supplying the logical unit;

the data supplied by the first barrel shift register directly supply the second shift register, a memory block being interposed between the second barrel shift register and the logical unit;

the second barrel shift register directly receives the length of the code decoded on the preceding cycle from the logical unit;

it comprises an adder associated with a memory block which receives on each cycle the length of the code decoded, calculates the cumulative total of these lengths since the last read of input data, commands the shift of the first register and the reading of a new input of data;

it is produced in the form of an integrated circuit by VLSI technology (very Large Scale Integrated technology);

it is intended for decoding a video signal coded according to the MPEG standard by Discrete Cosine Transformation (DCT) and quantization;

it is intended for decoding data recorded on an 5 interactive digital compact disc;

it is intended for decoding data recorded on a magnetic tape;

it is intended for decoding data transmitted by radio waves.

The disclosed innovative circuits are advantageously included in an innovative video codec chip, which can operate according to MPEG1, MPEG2, or H261 standards. Notable features of this chip include:

applicable to all three standards;

separation of the calculation of the length of the codes from the coding of the codes; this permits an increase in the speed of the arrangement by optimizing the element 16 by itself.

in that the time allocated to the decoding of a code and to determination of next state of the apparatus is one complete clock cycle, which permits optimization of the silicon surface dedicated to this portion.

BRIEF DESCRIPTION OF THE DRAWING

The disclosed inventions will be described with reference to the accompanying drawings, which show important sample embodiments of the invention and which are incorporated in the specification hereof by reference, wherein.

The invention will be better understood from the following detailed description of a particular embodiment of the invention given for the purposes of an example. It must be read in conjunction with the accompanying drawings in which.

DETAILED DESCRIPTION OF THE PREFERRED EMBODIMENTS

Figure 2:
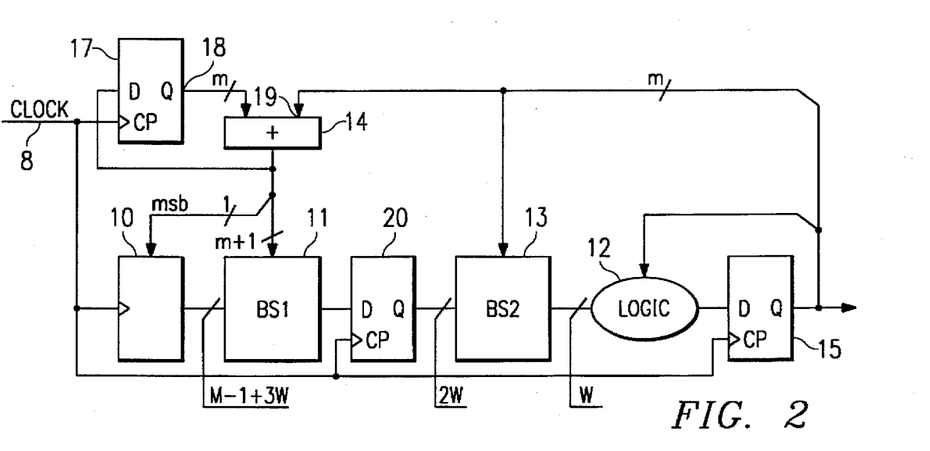
FIG. 2 is a block diagram of a first embodiment of the invention.
Figure 3:
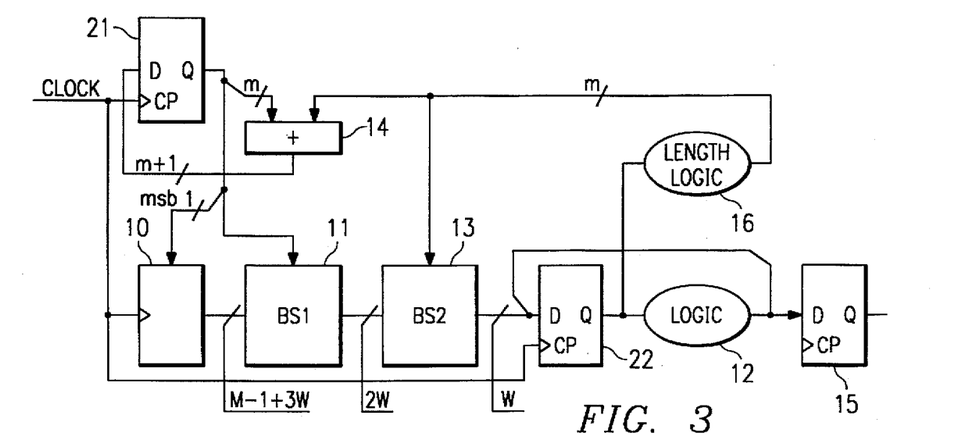
FIG. 3 is a block diagram of a second embodiment of the invention.

The numerous innovative teachings of the present application will be described with particular reference to the presently preferred embodiments (by way of example, and not of limitation), in which:

In both embodiments, the data are acquired from the outside by a memory unit 10 which is directly connected to a first barrel shift register 11. Logical unit 12 carries out the decoding processing and supplies the value m of the length of the last variable-length code decoded to a second barrel shift register 13, and also to an adder 14. Logical unit 12 supplies the result of its processing to a memory block 15. When adder 14 overflows (msb=1), it commands memory unit 10 to effect a new read operation.

The first embodiment of the invention will now be defined with reference in particular to FIG. 2.

A cumulative memory unit 17 is connected to the output of adder 14. Output 18 of said cumulative memory unit also supplies one of the inputs of adder 14, the other input of adder 14, input 19, being supplied from memory unit 15, as mentioned above, with a value m representing the length of the code decoded on the preceding clock cycle.

A memory block 20 is interposed between the first barrel shift register 11 and the second barrel shift register 13.

Thus, according to this device, at a given clock time, the first barrel shift register 11 receives a shift command signal m+1 corresponding to the cumulative total of the lengths of codes decoded since reception by input memory unit 10 of the last read instruction up to the given clock time mentioned above. During this time, memory unit 1, interposed between the first barrel shift register 11 and the second barrel shift register 12, contains the previous value supplied by first barrel shift register 11 corresponding to the shift produced by the cumulative total of the lengths of codes decoded since the time of reading by input memory unit 10 up to time t−1. A value produced by memory unit 20 is then received on an input to barrel shift register 13 which, on receiving a shift command m corresponding to the length of the code decoded during the preceding clock cycle by logical unit 12, supplies on its output, for supply to logical unit 12, data shifted by the cumulative total of the shift produced on the preceding cycle by the barrel shift register 11 and by its own shift value, i.e. the cumulative total of the lengths of codes decoded by logical unit 12 from the time of the read instruction up to and including the preceding cycle.

Logical unit 12 therefore accesses the data sought from those stored by memory block 10, i.e. those following exactly the codes which have already been decoded.

It is important to stress that in this device, processing time is limited only by the combined action of barrel register 13 and logical unit 12.

Indeed, during this clock cycle, second barrel shift register 13 must receive the shift value m produced from the result supplied by logical unit 12 in order to perform this shift, and then the logical unit having access to suitably defined input data can perform its processing.

Also during this time, first barrel shift register 11, working on data resulting not from the preceding cycle t−1 but on data originating from cycle t−2, can perform its own operations.

Since the value of the shift produced by the shift registers tends to limit the time required for these operations, we have thus achieved an important saving; the second barrel shift register 13 has only to perform a shift equal at the most to the size of the longest code likely to present itself. In practice, this length is often substantially less than the overall shift. Only this processing time taken by the second barrel shift register 13 is added to the processing time taken by logical unit 12.

In contrast, barrel shift register 11 which must be able to produce much larger shifts, is autonomous and can use the entire duration of a clock cycle to carry out its own operations.

We will now describe the second embodiment with reference to FIG. 3, in which the common blocks, filling the same function as those of the first embodiment, are referenced by the same numbers.

Memory unit 21 receives on input the signal produced by adder 14, and supplies via its output, on the one hand, adder 14 as in the first embodiment, and on the other hand, first barrel shift register 11.

Second barrel shift register 13 is directly connected to first barrel shift register 11. As in the first embodiment, it also receives the value m of the length of the last decoded code as a shift command.

Thus, second barrel shift register 13 supplies to a memory unit 22, placed between barrel shift register 13 and logical unit 12, a data element extracted from the input data received by the input memory unit 10 shifted by a length equal to the cumulative total of the lengths of the codes decoded up to and including the preceding clock cycle.

Logical unit 12 acquires these data from memory unit 22 and can then process them. At the same time, a length logic 16 is able to supply the length of the code decoded on the preceding cycle, this value being received by second barrel shift register 13 which applies it to the available data element originating from first barrel shift register 11 and thus supplies in a stable manner, via memory unit 22, the input value needed by logical unit 12 to carry out the following cycle.

During this time, adder 14 receives the value of the length of the last code decoded and supplies memory unit 21 which modifies the shift value of barrel shift register 11. This then performs its processing and performs a new shift in readiness for the next cycle.

Here again, the duration that limits the operating speed of this shift stage results from the cumulative total of the shift duration required by the second register, this duration being limited once again as in the preceding example to the size of the longest code to detect, and calculated with the processing time of logical unit 12.

Shift register 11, which may be required to perform a much larger shift since it concerns the shift of the cumulated length of codes detected since the last read instruction, has the entire clock cycle time to carry out its operation.

It can therefore be seen that according to one or other of the two embodiments, the use of two shift registers makes it possible to break down the shift operation into two suboperations which are performed simultaneously. These are, on the one hand, the main shift carried out by the first register for a value equal to the cumulative total of the length of codes detected up to clock cycle t−1 and, on the other hand, a smaller shift corresponding only to the value of the length of the code decoded at time t−1 and including the logic operation.

This breakdown makes it possible to produce the corresponding circuits on a small surface area of silicon and thereby minimizes production cost and power consumption for these circuits.

Description of the Context

The described apparatus is located in the context of a video decoder circuit which can meet the requirements of the MPEG1 and MPEG2 ISO standards, and/or of the H261 CCITT Recommendation. All of these standards are published, and their source documents are hereby incorporated by reference. Specifically and without limitation, all parts of International Standards 11172 (MPEG-1), 13818 (MPEG-2), and 14496 (MPEG-4), including all sub-parts thereof, and including all published drafts as well as final standards, as well as the H261 and H222.1 CCITT/ITU-T Recommendations, are all hereby incorporated by reference.

Figure 4:
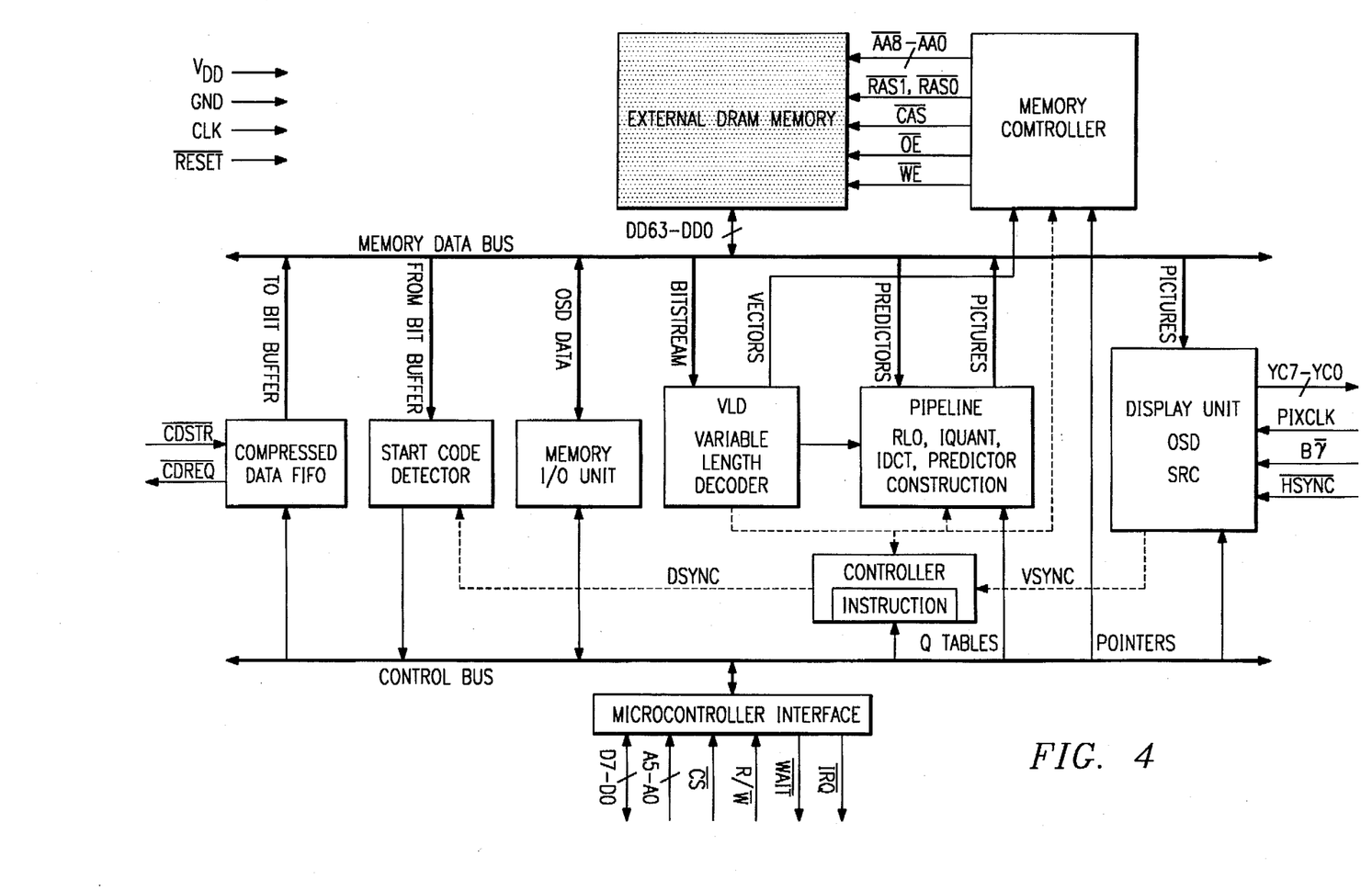
FIG. 4 is a high-level block diagram of the video codec chip of the presently preferred embodiment.
Figure 5:
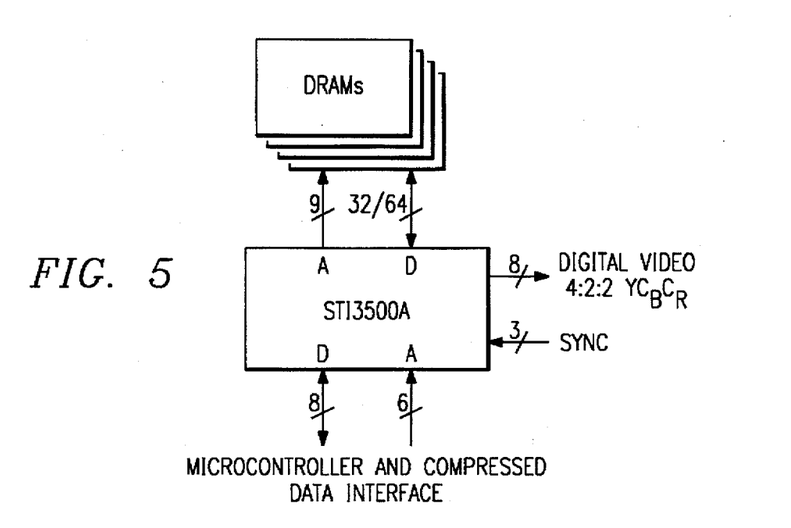
FIG. 5 schematically shows the interface to memory for the chip of FIG. 4.

FIG. 4 is a high-level block diagram of the video codec chip of the presently preferred embodiment, and FIG. 5 schematically shows the interface to memory for the chip of FIG. 4. The STi3500A is a real-time video decompression processor supporting the MPEG-1 and MPEG-2 standards at video rates up to 720×480×60 Hz or 720×576×50 Hz. the complete decoding function is realized with the STi3500A, a standard 8-bit microcontroller and a bank of DRAM memory. A typical memory configuration is four 256K×16 DRAMs.

The STi3500A requires minimal support from an external microcontroller, which is mainly required to initialize the decoder at the start of every picture. To aid the external processing of the upper layers of MPEG bitstream syntax, a start code detector is provided on-chip. In addition registers are provided to allow the tracking of time-stamps.

User-defined bitmaps may be superimposed on the displayed picture through use of the on-screen display function. These bitmaps are written directly into the DRAM memory by the microcontroller.

Picture format conversion for display is performed by a vertical and a horizontal filter (sample rate converter).

Undetected bitstream errors which would cause decoder errors bring into play an error concealment function, replacing the lost data with data from a previous picture.

Figure 6:
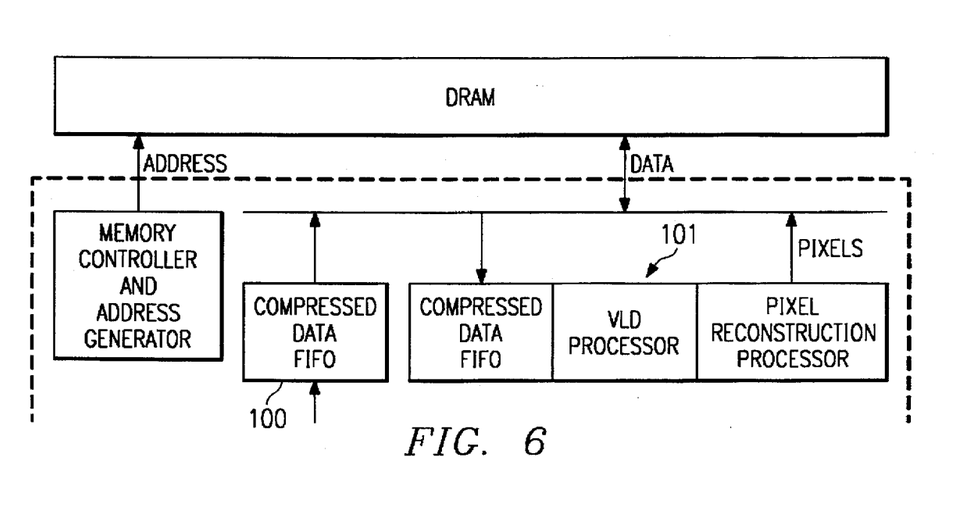
FIG. 6 shows a portion of the chip of FIG. 4, in relation to its interface to memory.

The following description refers to the schematic of FIG. 6, which shows a portion of the chip of FIG. 4, in relation to its interface to memory.

A video decoder circuit includes several processors sharing an external memory (normally DRAM). Control and access arbitration to the memory is managed by a memory controller inside the circuit. The various processors are connected to a data bus of a memory, and communicate through FIFOs. This arrangement from its optimization of the usage of the bandwidth of the memory, while imposing no unacceptable burdens on the utilization of the different processors, and is described in French patent applications 93/06612 (filed May 27, 1993) and 93/08837 (filed Jul. 12, 1993), which are both hereby incorporated by reference.

The data flow is as follows. The compressed data are input into the circuit, and are buffered in the FIFO 100. From there, the data are rapidly transferred into a larger buffer located in memory. When an image must be decoded, the compressed data for that image are transferred from the buffer in memory into the FIFO 101 which is located in the stream of the decoding processor. The decoding processor transforms the compressed data into pixels which are in turn transferred into memory. From there, these pixel values can be fetched later when required for display.

The different stages of the decoding processor are:

the Variable Length Decoder or VLD;

the Inverse Quantizer or IQ;

the Inverse Discrete Cosine Transform processor or IDCT;

the movement compensation filter; and the reconstruction adder.

The present invention relates to the input to the VLD, which serves to align the successive variable-length codes before they are decoded.

Description of the Variable Length Codes

The variable length codes utilized in the MPEG1, MPEG2, and H261 standards are Huffman codes. Various VLC tables are specified in each of these standards, e.g. 14 tables are specified in the MPEG1 standard. According to the nature of the symbols to be coded (e.g. a movement compensation vector), one or another table will be used.

The standards specifies exactly in which order the symbols of different types must follow each other in the flow of compressed data.

The VLD processor determines which table to use by determining the nature of the present code in accordance with the codes decoded earlier. This processor, therefore, includes a state machine functionality in order to discriminate between the various VLD tables.

Description of the Element 10

Figure 7:
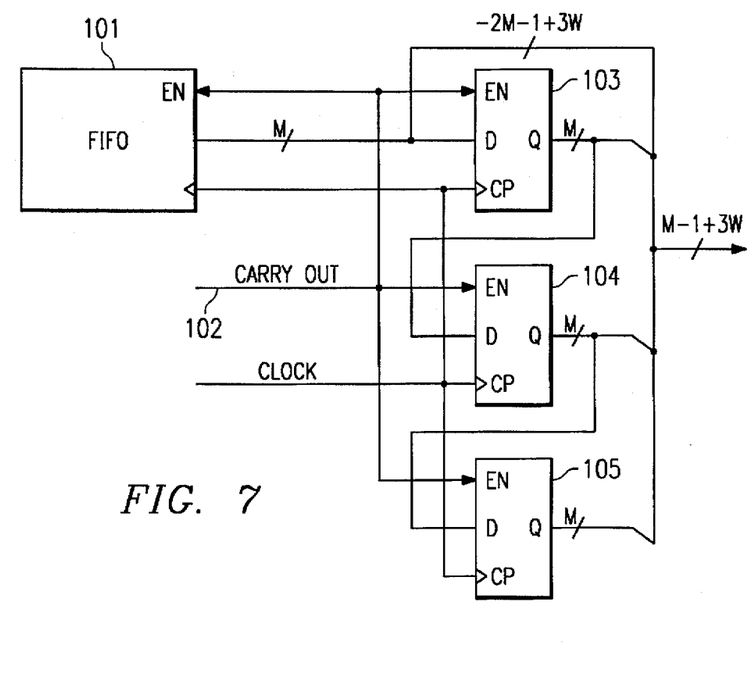
FIG. 7 shows further detail of the implementation of FIG. 2.

FIG. 7 shows further detail of the implementation of FIG. 2. The element 10 includes a FIFO 101 followed by reformatting registers which prevent a wide word to the barrel shifter 11. The width of the FIFO (M) must satisfy the condition $M \geq W$ in order for the VLD to be able to decode one symbol per clock cycle. In practice, the worst case occurs when successive codes of maximum length W must be decoded while the FIFO must provide one word per clock cycle. M is selected as a power of 2 ($M=2^m$) in order to facilitate simultaneously the interfacing to the memory bus and generation of the read command from the FIFO 102. The FIFO 102 is thus dedicated solely to holding the output accumulator 19. M is also selected to be as small as possible, i.e. to satisfy the condition $2W>M \geq W$, and therefore m is in practice the number of bits necessary to represent W in base 2.

From the words successively read into the FIFO, the registers 103 through 105 reconstitute a word of width $M-1+3W$ at the input to the barrel shifter 11.

Since $2W>M$, it may be seen that $3W>(3/2)M$, and therefore $M-1+W>(5/2)M-1$. Since $M \geq W$, it may be seen that $3M \geq 3W$ and therefore $4M-1 \geq M-1+3W$.

Therefore, the width of the word which is the output of the reformatting stage will be in the range of $4M-1 \geq M-1+3W \geq (5/2)M-1$. From this it may be seen that this word is formed from three or four consecutively read words for FIFO. The condition which determines whether four consecutive words are necessary may be written as $M-1+3W>3M$, i.e. $3W>2M+1$. FIG. 7 represents the case of four consecutive words. The case of three consecutive words is simply obtained by deleting the element 105.

4. Description of the Elements 12 and 16

At the output of barrel shifter 13, the decoding stage performs three functions:

1. calculation of the length of the current VLC code;
2. decoding the symbol associated with a current code; and
3. calculating the next state of the state machine, which will determine which VLC table the next code belongs to.

These functions are simply described in a logic table which includes an output state for each input state. The physical realization of these functions may therefore be in the form of a PLA or alternatively in the form of random logic obtained by automatic synthesis of the table.

By describing and synthesizing the collection of tables for the different standards MPEG1, MPEG2 and H261, the described apparatus permit a compressed data stream corresponding to any of these norms to be decoded.

The advantage in separating the generation of the length of the codes from the other functions is to permit a better speed/area compromise to be obtained. In practice, the functions 2 and 3 need an entire clock cycle to be evaluated, while the function 1 requires a fraction of a cycle by itself, since it is part of a critical path which includes the other blocks. Each function can therefore be synthesized optimally with the respective its temporal constraints.

Timing Diagrams

Figure 8:
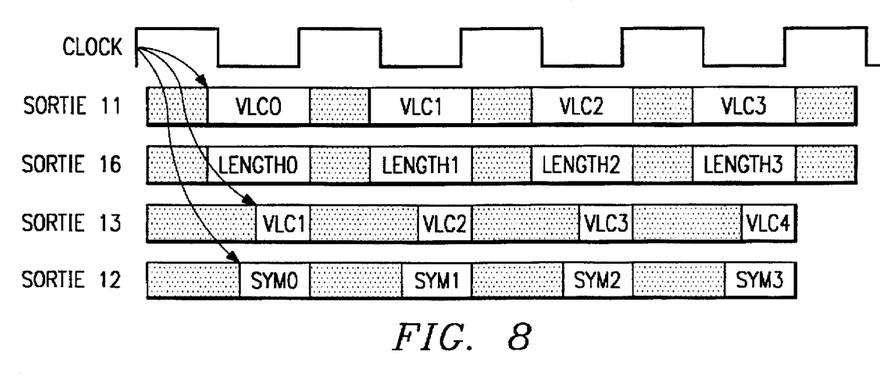
FIG. 8 shows timing relations preferably used in the chip of FIG. 4.

FIG. 8 shows timing relations preferably used in the chip of FIG. 4.

On a data cycle of a clock, element 16 evaluates the length of the VLC presented by the element 13 preceding cycle, and the element 11 aligns its output to the same VLC (eg. VLC0).

From this information and in the course of the same cycle, element 13 aligns its output on the following VLC (VLC1). Still in the course of the same cycle, element 12 decodes the symbol associated with the VLC presented by element 13 in the preceding cycle (VLC0). The critical paths are the following:

from the output of the flip flop 22 to the input of the flip flop 15, passing through element 12;

from the output of the flip flop 22 to the input of the flip flop 22 going through the elements 16 and then 13; and from the output of the flip flop 21 to the input of the flip flop 22 passing through the elements 11 and then 13.

As will be recognized by those skilled in the art, the innovative concepts described in the present application can be modified and varied over a tremendous range of applications, and accordingly the scope of patented subject matter is not limited by any of the specific exemplary teachings given. For example, as will be obvious to those of ordinary skill in the art, other circuit elements can be added to, or substituted into, the specific circuit topologies shown.

What is claimed is:

1. Shifter stage for variable-length digital codes decoding one code per clock cycle which reads input data originating from a memory, supplies a decoding logical unit on each cycle with a word having the size of the longest variable length code to be decoded, receives from the logical unit the number of bits of the code decoded on the preceding clock cycle, and performs a shift in the read data equal to the cumulative total of the lengths of codes already decoded since the last read of the input data, wherein it comprises a first barrel shift register which reads the input data and performs a shift in the data read equal to the cumulative total of the lengths of codes decoded between the preceding cycle and the start of the last read, and a second barrel shift register which receives data arriving from the first register and directly receives from the logical unit the length of the code decoded on the preceding cycle and performs a shift equal to the length of the code decoded at the time of the preceding cycle.

2. The shifter stage of claim 1, wherein it comprises an adder associated with a memory block which receives on each cycle the length of the code decoded, calculates the cumulative total of these lengths since the last read of input data, commands the shift of the first register and the reading of a new input data.

3. The shifter stage of claim 1, wherein it is produced in the form of an integrated circuit by VLSI technology.

4. The shifter stage of claim 1, wherein it is intended for decoding data recorded on an interactive digital compact disc.

5. The shifter stage of claim 1, wherein it is intended for decoding data recorded on a magnetic tape.

6. The shifter stage of claim 1, wherein it is intended for decoding data transmitted by radio waves.

7. The shifter stage of claim 1, wherein a memory block is interposed between the first barrel shift register and the second barrel shift register, the data supplied by the second barrel shift register directly supplying the logical unit.

8. The shifter stage of claim 1, wherein the data supplied by the first barrel shift register directly supply the second shift register, a memory block being interposed between the second barrel shift register and the logical unit.

9. The shifter stage of claim 1, wherein it is intended for decoding a video signal coded according to the MPEG standard by Discrete Cosine Transformation (DCT) and quantization.

10. Shifter stage for variable-length digital codes which decodes a video signal coded according to the MPEG standard by Discrete Cosine Transformation and quantization, decoding one code per clock cycle which:

reads input data originating from a memory, supplies a decoding logical unit on each cycle with a word having the size of the longest variable length code to be decoded, receives from the logical unit the number of bits of the code decoded on the preceding clock cycle, and performs a shift in the read data equal to the cumulative total of the lengths of codes already decoded since the last read of the input data;

wherein said shifter stage comprises first barrel shift register which reads the input data and performs a shift in the data read equal to the cumulative total of the lengths of codes decoded between the preceding cycle and the start of the last read, and a second barrel shift register which receives data arriving from the first register and performs a shift equal to the length of the code decoded at the time of the preceding cycle;

wherein the data supplied by the first barrel shift register directly supply the second shift register, a memory block being interposed between the second barrel shift register and the logical unit.

11. The shifter stage of claim 10, wherein the second barrel shift register directly receives the length of the code decoded on the preceding cycle from the logical unit.

12. The shifter stage of claim 10, further comprising an adder associated with a memory block which receives on each cycle the length of the code decoded, calculates the cumulative total of these lengths since the last read of input data, commands the shift of the first register and the reading of a new input data.

13. The shifter stage of claim 10, wherein it is produced in the form of an integrated circuit by VLSI technology.

14. The shifter stage of claim 10, wherein it is intended for decoding data recorded on an interactive digital compact disc.

15. The shifter stage of claim 10, wherein it is intended for decoding data recorded on a magnetic tape.

16. The shifter stage of claim 10, wherein it is intended for decoding data transmitted by radio waves.

17. A shifter stage for variable-length digital codes which decodes a video signal coded according to the MPEG standard by Discrete Cosine Transformation and quantization, decoding one code per clock cycle, comprising:

a first barrel-shift circuit connected to receive said an M-bit coded data, to shift said data according to a first shift input signal, and to produce a coded data-word;

a second barrel-shift circuit connected to receive said coded data-word, to shift said coded data-word according to a second shift input signal; and to produce a shifted data-word;

a logic circuit connected to receive said shifted data-word; decode said shifted data-word; and to produce a decoded output and a second shift input signal indicating the bit-length of said decoded output;

an adder circuit associated with a memory block which receives on each cycle said second shift input signal, calculates the cumulative total of the bit-lengths of said second shift input signal since the last read of said coded data, produces said first shift input signal, and forces the reading of a new coded input data; and wherein the second barrel-shift circuit directly receives said second shift input signal from the logic circuit.

18. The shifter stage of claim 17, wherein it is produced in the form of an integrated circuit by VLSI technology.

19. The shifter stage of claim 17, wherein it is intended for decoding data recorded on an interactive digital compact disc.

20. The shifter stage of claim 17, wherein it is intended for decoding data recorded on a magnetic tape.

21. The shifter stage of claim 17, wherein it is intended for decoding data transmitted by radio waves.

* * * * *